(12) United States Patent
Li

(10) Patent No.: US 11,973,496 B2
(45) Date of Patent: Apr. 30, 2024

(54) DRIVE CIRCUIT

(71) Applicant: CHANGXIN MEMORY TECHNOLOGIES, INC., Hefei (CN)

(72) Inventor: Siman Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 12 days.

(21) Appl. No.: 18/151,437

(22) Filed: Jan. 8, 2023

(65) Prior Publication Data

US 2023/0353146 A1 Nov. 2, 2023

Related U.S. Application Data

(63) Continuation of application No. PCT/CN2022/108131, filed on Jul. 27, 2022.

(30) Foreign Application Priority Data

Apr. 29, 2022 (CN) .......................... 202210465468.2

(51) Int. Cl.
*H03K 7/08* (2006.01)
*H03K 3/017* (2006.01)
(Continued)

(52) U.S. Cl.
CPC ........... *H03K 17/693* (2013.01); *H03K 3/017* (2013.01); *H03K 7/08* (2013.01); *H03K 17/6872* (2013.01); *H03K 19/01* (2013.01); *H03K 19/20* (2013.01)

(58) Field of Classification Search
CPC ........... H03K 3/01; H03K 3/017; H03K 7/00; H03K 7/08; H03K 17/687; H03K 17/6871;
(Continued)

(56) References Cited

U.S. PATENT DOCUMENTS 7,071,780 B2 * 7/2006 Van Zanten ........ H03F 3/45941
330/9
7,834,697 B1 11/2010 Lipka
(Continued)

FOREIGN PATENT DOCUMENTS

CN 103532522 A 1/2014
CN 104660246 A 5/2015
(Continued)

OTHER PUBLICATIONS

ISA State Intellectual Property Office of the People's Republic of China, International Search Report Issued in Application No. PCT/CN2022/108131, Jan. 18, 2023, WIPO, 10 pages.

*Primary Examiner* — Long Nguyen
(74) *Attorney, Agent, or Firm* — Kilpatrick Townsend & Stockton LLP

(57) ABSTRACT

A drive circuit includes: an input stage configured to receive a first input signal and a second input signal, and to output a first output signal and a common-mode output signal, where the first input signal and the second input signal are complementary signals; an output stage configured to receive the first output signal, and to output a second output signal; and a duty cycle adjusting subcircuit configured to determine the first output signal and the common-mode output signal or a signal obtained by inverting the common-mode output signal as a control signal, and to adjust a duty cycle of the second output signal. The drive circuit determines the common-mode output signal or the signal obtained by inverting the common-mode output signal as the control signal of the duty cycle adjusting subcircuit, and adjusts the duty cycle of the second output signal to tend to a preset value.

17 Claims, 7 Drawing Sheets

(51) Int. Cl.
*H03K 17/687* (2006.01)
*H03K 17/693* (2006.01)
*H03K 19/01* (2006.01)
*H03K 19/20* (2006.01)

(58) Field of Classification Search
CPC .. H03K 17/6872; H03K 17/693; H03K 19/01; H03K 19/017; H03K 19/20; H03F 3/45479; H03F 3/45632; H03F 2203/45008
See application file for complete search history.

(56) References Cited

U.S. PATENT DOCUMENTS

2010/0301936 A1* 12/2010 Lipka .................. H03F 3/45475
330/149
2018/0219534 A1 8/2018 Ray et al.

FOREIGN PATENT DOCUMENTS

| CN | 106911330 A | 6/2017 |
| CN | 111628728 A | 9/2020 |

* cited by examiner

DRIVE CIRCUIT

CROSS-REFERENCE TO RELATED APPLICATION

This application is a continuation of PCT/CN2022/108131, filed on Jul. 27, 2022, which claims priority to Chinese Patent Application No. 202210465468.2, titled "DRIVE CIRCUIT" and filed on Apr. 29, 2022, the entire contents of which are incorporated herein by reference.

TECHNICAL FIELD

The present disclosure relates to the field of integrated circuits, and more particularly, to a drive circuit.

BACKGROUND

For a memory, a controller is generally needed to send clock signals to a drive circuit. When transmitted between the controller and the drive circuit, the clock signals need to pass through channels such as PKG, Socket, and slot. In this case, the clock signals may be attenuated, and there are impedance matching and other situations, which may lead to reflection, causing a consequence that the clock signals sent to the driver circuit have different amplitudes and different input common-mode voltages. Due to different input common-mode voltages, the signals may change greatly after being transmitted into the drive circuit, which directly affects the function of the clock signals. Therefore, how to reduce influence of different input common-mode voltages is a key and difficult point in drive circuit design.

SUMMARY

Embodiments of the present disclosure provide a drive circuit, which includes: an input stage configured to receive a first input signal and a second input signal, and to output a first output signal and a common-mode output signal, where the first input signal and the second input signal are complementary signals; an output stage configured to receive the first output signal, and to output a second output signal; and a duty cycle adjusting subcircuit configured to determine the first output signal and the common-mode output signal or a signal obtained by inverting the common-mode output signal as a control signal, and to adjust a duty cycle of the second output signal.

DETAILED DESCRIPTION

Figure 1:
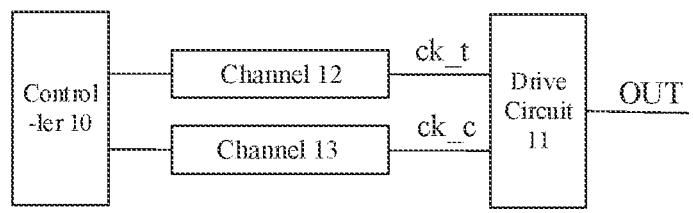
FIG. 1 is a schematic diagram of signal transmission between a controller and a drive circuit.
Figure 2:
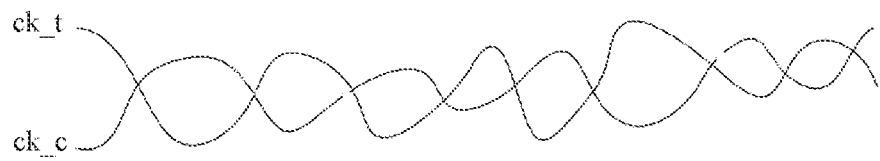
FIG. 2 is a schematic diagram of complementary clock signals inputted to an input terminal of a drive circuit.

FIG. 1 is a schematic diagram of signal transmission between a controller and a drive circuit. Referring to FIG. 1, a controller 10 provides complementary signals to a drive circuit 11. The complementary signals may be complementary clock signals. The complementary clock signals need to respectively pass through channels 12 and 13 when transmitted between the controller 10 and the drive circuit 11. In this case, the complementary clock signals are attenuated during the transmission, and there are impedance matching and other situations, which may lead to reflection, causing a consequence that input common-mode voltages of complementary clock signals ck_c and ck_t transmitted to an input terminal of the drive circuit 11 are different. As shown in FIG. 2, which is a schematic diagram of the complementary clock signals inputted to the input terminal of the drive circuit, as can be seen, the complementary clock signals ck_c and ck_t transmitted to the input terminal of the drive circuit 11 have different amplitudes and different input common-mode voltages, such that the clock signals may change greatly after passing through the drive circuit, which directly affects functions of the clock signals outputted from an output terminal OUT of the drive circuit.

To solve the above technical problem, embodiments of the present disclosure provide a drive circuit, which includes: an input stage configured to receive a first input signal and a second input signal, and to output a first output signal and a common-mode output signal, where the first input signal and the second input signal are complementary signals; an output stage configured to receive the first output signal, and to output a second output signal; and a duty cycle adjusting subcircuit configured to determine the first output signal and the common-mode output signal or a signal obtained by inverting the common-mode output signal as a control signal, and to adjust a duty cycle of the second output signal.

In the drive circuit provided by the embodiments of the present disclosure, a common-mode output signal between a first input signal and a second input signal complementary to each other or a signal obtained by inverting the common-mode output signal is determined as the control signal of the duty cycle adjusting subcircuit, and a duty cycle of a second output signal is adjusted to tend to a preset value. For example, the duty cycle of the second output signal tends to 50%. That is, although input common-mode voltages of the first input signal and the second input signal are different, after being adjusted by the duty cycle adjusting subcircuit, finally the duty cycles of output signals outputted by the drive circuit tend to the preset value, and no greater change may be caused, such that output performance of the drive circuit is improved.

The drive circuit provided by the embodiments of the present disclosure will be described in detail below with reference to the accompanying drawings.

Figure 3:
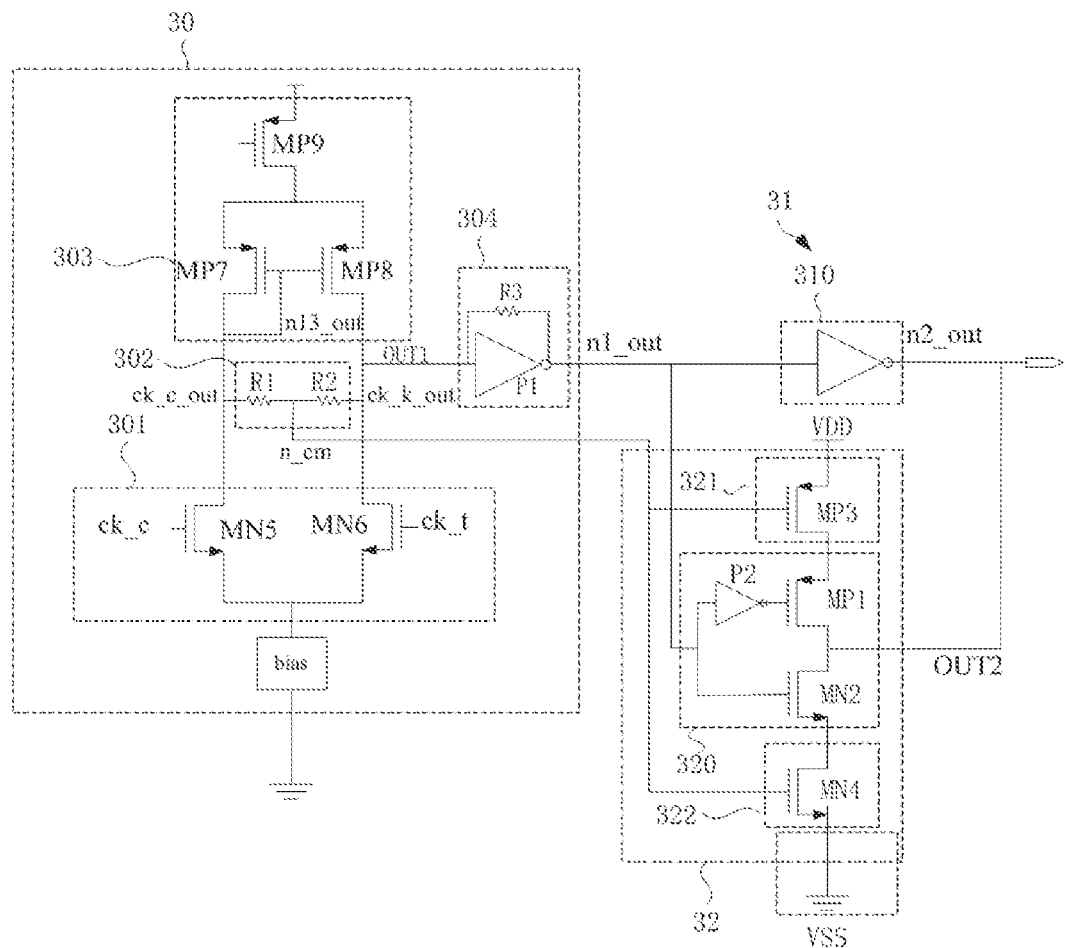
FIG. 3 is a schematic diagram of a drive circuit provided by a first embodiment of the present disclosure.

FIG. 3 is a schematic diagram of a drive circuit provided by a first embodiment of the present disclosure. Referring to FIG. 3, the drive circuit includes an input stage 30, an output stage 31, and a duty cycle adjusting subcircuit 32.

The input stage 30 is configured to receives a first input signal ck_c and a second input signal ck_t, and output a first output signal n1_out and a common-mode output signal n_cm, where the first input signal ck_c and the second input signal ck_t are complementary signals. The input stage 30 can shape the complementary first input signal ck_c and the second input signal ck_t into a single-ended square wave signal, i.e., the first output signal n1_out.

The input stage serves as a buffer architecture for the drive circuit. For example, this embodiment further provides a circuit structure of the input stage 30. With continued reference to FIG. 3, the input stage 30 includes a common output terminal OUT1, a signal receiving subcircuit 301, a common-mode subcircuit 302, and a control subcircuit 303.

The common output terminal OUT1 is configured to output the first output signal n1_out. In this embodiment, the input stage 30 further includes a first-stage phase inversion subcircuit 304, where an input terminal of the first-stage phase inversion subcircuit 304 is connected to the common output terminal OUT1, an output signal from the common output terminal OUT1 of the input stage 30 serves as an input signal of the first-stage phase inversion subcircuit 304, and an output signal from the first-stage phase inversion subcircuit 304 serves as the first output signal n1_out. The output signal from the common output terminal OUT1 of the input stage 30 is inverted and shaped via the first-stage phase inversion subcircuit 304 and is outputted as the first output signal n1_out to improve signal quality. The first-stage phase inversion subcircuit 304 is formed by connecting odd number of phase inverters in series. For example, in this embodiment, the first-stage phase inversion subcircuit 304 includes one first phase inverter P1, and in other embodiment, the first-stage phase inversion subcircuit 304 is formed by connecting three or more phase inverters in series.

In this embodiment, the first-stage phase inversion subcircuit 304 includes a first phase inverter P1, where an input terminal and an output terminal of the first phase inverter P1 are connected to each other via a resistor R3, to improve stability of the first-stage phase inversion subcircuit 304.

The signal receiving subcircuit 301 is connected to the common output terminal OUT1 to receive the first input signal ck_c and the second input signal ck_t, and to output a first output sub-signal ck_c_out and a second output sub-signal ck_t_out complementary to each other, where the second output sub-signal ck_t_out is outputted to the common output terminal OUT1.

In this embodiment, the signal receiving subcircuit 301 includes a fifth transistor and a sixth transistor. The fifth transistor is configured to determine the first input signal ck_c as the control signal, where a terminal of the fifth transistor is connected to a bias circuit bias, and other terminal of the fifth transistor serves as an output terminal to output the first output sub-signal ck_c_out. The sixth transistor is configured to determine the second input signal ck_t as the control signal, where a terminal of the sixth transistor is electrically connected to the bias circuit bias, and other terminal of the sixth transistor serves as the output terminal to output the second output sub-signal ck_t_out. The fifth transistor and the sixth transistor are transistors of the same type. For example, in this embodiment, the fifth transistor is an NMOS transistor MN5, and the sixth transistor is an NMOS transistor MN6. In some other embodiments, the fifth transistor and the sixth transistor are both PMOS transistors.

The common-mode subcircuit 302 is connected to the signal receiving subcircuit 301, and is configured to output the common-mode output signal n_cm according to a voltage difference between the first output sub-signal ck_c_out and the second output sub-signal ck_t_out.

In this embodiment, the common-mode subcircuit 302 includes a first resistor R1 and a second resistor R2 connected in series. A terminal of the first resistor R1 is connected to the signal receiving subcircuit 301 to receive the first output sub-signal ck_c_out outputted by the fifth transistor, a terminal of the second resistor R2 is connected to the signal receiving subcircuit 301 to receive the second output sub-signal ck_t_out outputted by the sixth transistor, and a common terminal between the first resistor R1 and the second resistor R2 is used as the output terminal of the common-mode subcircuit 302 to output the common-mode output signal n_cm. In some embodiments, the first resistor R1 and the second resistor R2 have an equal resistance to reduce an output deviation of the common-mode output signal n_cm caused by different resistances of the first resistor R1 and the second resistor R2, where the output common-mode voltage Vn_cm of the common-mode output signal n_cm is equal to (Vck_c_out+Vck_t_out)/2. In some embodiments, the resistance of the first resistor R1 and the resistance of the second resistor R2 are set to be maximum under the condition that the circuit design conditions are met, thereby avoiding the leveling-off of voltage on two sides due to the too low resistance.

A terminal of the control subcircuit 303 is electrically connected to a power supply, and other terminal of the control subcircuit 303 is electrically connected to the common output terminal OUT1, and the first output sub-signal ck_c_out outputted by the fifth transistor is determined as an input signal to output a third output sub-signal n13_t_out, where the third output sub-signal n13_t_out and the second output sub-signal ck_t_out together serve as the first output signal n1_out. The power supply may be a device power supply.

In this embodiment, the control subcircuit 303 includes a seventh transistor and an eighth transistor, where a gate and a drain of the seventh transistor are short-circuited, the drain of the seventh transistor is configured to receive the first output sub-signal ck_c_out, and a source of the seventh transistor is electrically connected to the power supply. A gate of the eighth transistor is configured to receive the first output sub-signal ck_c_out, a source of the eighth transistor is electrically connected to the power supply, and a drain of the eighth transistor is connected to the common output terminal OUT1 to output the third output sub-signal n13_out. In this embodiment, the seventh transistor and the eighth transistor are transistors of the same type, where the seventh transistor is a PMOS transistor MP7, and the eighth transistor is a PMOS transistor MP8. In some other embodiments, the seventh transistor and the eighth transistor are both NMOS transistors.

In this embodiment, the control subcircuit 303 further includes a ninth transistor MP9. A gate of the ninth transistor MP9 is configured to receive a clock enable signal, a source of the ninth transistor MP9 is electrically connected to the power supply, and a drain of the ninth transistor MP9 is electrically connected to the source of the seventh transistor MP7 and the source of the eighth transistor MP8. The ninth transistor MP9 is used as a switch of the control subcircuit 303. In this embodiment, the ninth transistor MP9 is a PMOS transistor, and in some other embodiments, the ninth transistor MP9 is an NMOS transistor.

The output stage 31 is configured to receive the first output signal n1_out and output a second output signal n2_out. After the first output signal n1_out is shaped by the output stage 31, the second output signal n2_out is outputted.

In this embodiment, the output stage 31 includes a second-stage phase inversion subcircuit 310, the first output signal n1_out serves as an input signal of the second-stage phase inversion subcircuit 310, and an output signal of the second-stage phase inversion subcircuit 310 serves as the second output signal n2_out. The second-stage phase inversion subcircuit 310 may comprise odd or even number of phase inverters connected in series. For example, in this embodiment, the second-stage phase inversion subcircuit 310 comprises one phase inverter, and the first output signal n1_out is inverted by the phase inverter, and then the inverted first output signal n1_out is outputted as the second output signal n2_out. In some other embodiments, the second-stage phase inversion subcircuit 310 comprises three or more odd-numbered phase inverters connected in series, the first output signal n1_out is inverted by the series-connected phase inverters, and then the inverted first output signal n1_out is outputted as the second output signal n2_out. In yet other embodiments, the second-stage phase inversion subcircuit 310 may comprise even number of phase inverters connecting in series, and after the first output signal n1_out is shaped by the output stage 31, the second output signal n2_out is outputted.

The duty cycle adjusting subcircuit 32 adjusts the duty cycle of the second output signal n2_out by using the first output signal n1_out and the common-mode output signal n_cm as the control signal.

This embodiment provides a circuit structure of the duty cycle adjusting subcircuit 32. With continued reference to FIG. 3, the duty cycle adjusting subcircuit 32 includes a switching subcircuit 320, a pull-up subcircuit 321, and a pull-down subcircuit 322.

Whether the duty cycle adjusting subcircuit 32 works is controlled via the turn-on and turn-off of the switching subcircuit 320. The switching subcircuit 320 determines the first output signal n1_out as the control signal, and controls the turn-on and turn-off of the switching subcircuit 320.

In this embodiment, the switching subcircuit 320 includes a first transistor MP1 and a second transistor MN2, where the first transistor MP1 and the second transistor MN2 are different types of transistors. In this embodiment, the first transistor MP1 is a PMOS transistor, and the second transistor MN2 is an NMOS transistor. A terminal of the first transistor MP1 is electrically connected to the pull-up subcircuit 321, and other terminal of the first transistor MP1 is electrically connected to the output terminal OUT2 of the duty cycle adjusting subcircuit 32. After the first output signal n1_out is inverted by a phase inverter P4, the inverted first output signal n1_out serves as the control signal of the first transistor MP1 of the switching subcircuit 320. A terminal of the second transistor MN2 is electrically connected to the pull-down subcircuit 322, other terminal of the second transistor MN2 is electrically connected to the output terminal OUT2 of the duty cycle adjusting subcircuit 32, and a control terminal of the second transistor MN2 uses the first output signal n1_out as the control signal.

The pull-up subcircuit 321 is connected to a first power supply VDD, and uses the common-mode output signal n_cm as the control signal. The pull-up subcircuit 321 is connected to the output terminal OUT2 of the duty cycle adjusting subcircuit 32 through the switching subcircuit 320.

The pull-down subcircuit 322 is connected to a second power supply VSS, and uses the common-mode output signal n_cm as the control signal. The pull-down subcircuit 322 is connected to the output terminal OUT2 of the duty cycle adjusting subcircuit 32 through the switching subcircuit 320.

In this embodiment, the pull-up subcircuit 321 includes a third transistor MP3, and the pull-down subcircuit 322 includes a fourth transistor MN4, where the third transistor MP3 and the fourth transistor MN4 are different types of transistors. In this embodiment, the third transistor MP3 is a PMOS transistor, and the fourth transistor MN4 is an NMOS transistor.

The drive circuit provided by the first embodiment of the present disclosure can automatically adjust the duty cycle of the second output signal. When the input common-mode voltage of the first input signal is different from the input common-mode voltage of the second input signal, the duty cycle of the output signal finally outputted by the drive circuit tend to the preset value. That is, even if the input common-mode voltage of the first input signal and the input common-mode voltage of the second input signal are changed due to influences of factors such as channel transmission, the output signal finally outputted by the drive circuit may not fluctuate greatly, which improves the output performance of the drive circuit. Principles are described below.

Figure 4:
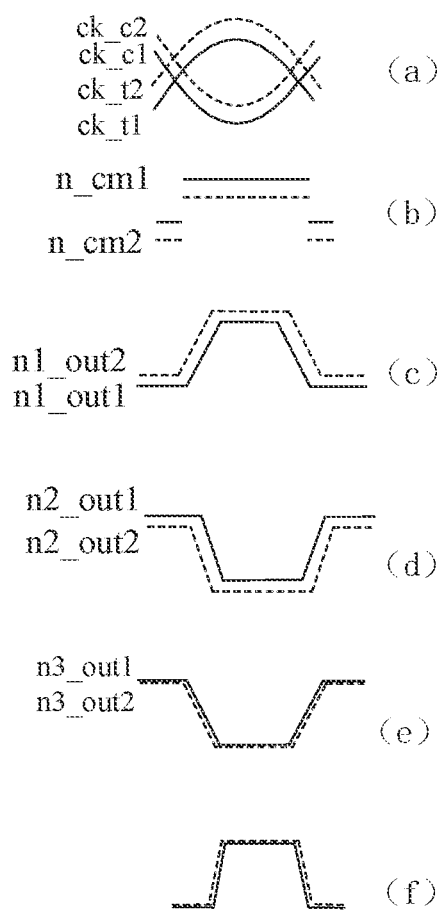
FIG. 4 is a signal waveform diagram of each node in FIG. 3.

Referring to FIG. 3 and FIG. 4, FIG. 4(a) is a waveform diagram of the first input signal and the second input signal, where solid lines represent waveforms of the first input signal ck_c1 and the second input signal ck_t1 actually inputted, and dashed lines represent waveforms of the first input signal ck_c2 and the second input signal ck_t2 preset. As can be seen from FIG. 4, the input common-mode voltages of the first input signal ck_c1 and the second input signal ck_t1 actually inputted are lower than the input common-mode voltages of the first input signal ck_c2 and the second input signal ck_t2 preset. The first input signal ck_c2 and the second input signal ck_t2 preset refer to ideal signals not adversely affected by factors such as channel attenuation during signal transmission.

Referring to FIG. 3 and FIG. 4, FIG. 4(b) is a waveform diagram of the common-mode output signal n_cm in FIG. 3, where the solid line represents the waveform diagram of the common-mode output signal n_cm1 formed by determining the first input signal ck_c1 and the second input signal ck_t1 actually inputted as the input signal, and the dashed line represents the waveform diagram of the common-mode output signal n_cm2 formed by determining the first input signal ck_c2 and the second input signal ck_t2 preset as the input signal. As can be seen from FIG. 4, the output common-mode voltage of the common-mode output signal n_cm1 is higher than the output common-mode voltage of the common-mode output signal n_cm2.

Referring to FIG. 3 and FIG. 4, FIG. 4(c) is a waveform diagram of the first output signal n1_out outputted by the output terminal of the first-stage phase inversion subcircuit 304 in FIG. 3, where the solid line represents the waveform diagram of the first output signal n1_out1 formed by determining the first input signal ck_c1 and the second input signal ck_t1 actually inputted as the input signal, and the dashed line represents the waveform diagram of the first output signal n1_out2 formed by determining the first input signal ck_c2 and the second input signal ck_t2 preset as the input signal. As can be seen from FIG. 4, the duty cycle of the first output signal n1_out1 is smaller than the duty cycle of the first output signal n1_out2. That is, the duty cycle of the first output signal n1_out1 is smaller than a preset value. The preset value may be 50%.

Referring to FIG. 3 and FIG. 4, FIG. 4(d) is a waveform diagram of the second output signal n2_out outputted by the output stage 31 in FIG. 3, where the solid line represents the waveform diagram of the second output signal n2_out1 formed by determining the actually outputted first output signal n1_out1 as the input signal of the output stage 31, and the dashed line represents the waveform diagram of the second output signal n2_out2 formed by determining the preset first output signal n1_out2 as the input signal of the output stage 31. As can be seen from FIG. 4, low-level time of the second output signal n2_out1 is shorter than that of the second output signal n2_out2. That is, the duty cycle of the second output signal n2_out1 is greater than that of the second output signal n2_out2.

To make the duty cycle of the second output signal n2_out1 tend to the preset value, the second output signal n2_out1 needs to be pulled down to prolong its low-level time. Because the first input signal ck_c and the second input signal ck_t are outputted via the N-channel metal oxide semiconductor (NMOS) transistor, the lower the input common-mode voltages of the first input signal ck_c and the second input signal ck_t are, the higher the output common-mode voltage of the common-mode output signal n_cm is. For example, in this embodiment, the input common-mode voltages of the first input signal ck_c1 and the second input signal ck_t1 actually inputted are lower than the preset input common-mode voltage. In this case, the output common-mode voltage of the common-mode output signal n_cm1 is higher than the output common-mode voltage of the preset common-mode output signal n_cm2, such that pull-down capacity of the pull-down subcircuit 322 of the duty cycle adjusting subcircuit 32 is better than pull-up capacity of the pull-up subcircuit 321, such that the output signal from the output terminal OUT2 of the duty cycle adjusting subcircuit 32 pulls down the second output signal n2_out1 to reduce its duty cycle, thereby forming the final output signal. FIG. 4(e) is a waveform diagram of the output signal finally outputted by the drive circuit, where the solid line represents the waveform diagram of the final output signal n3_out1 formed after the second output signal n1_out1 is adjusted by the duty cycle adjusting subcircuit, and the dashed line represents the waveform diagram of the preset final output signal n3_out2. As can be seen from FIG. 4, the duty cycle of the final output signal n3_out1 is approximate to the duty cycle of the final output signal n3_out, which improves the output stability of the drive circuit.

It is to be understood that in this embodiment, the lower the first input signal ck_c1 and the second input signal ck_t1 actually inputted are, the higher the output common-mode voltage of the common-mode output signal n_cm is, the better the pull-down capacity of the pull-down subcircuit 322 of the duty cycle adjusting subcircuit 32 is than the pull-up capacity of the pull-up subcircuit 322, and the more the output signal from the output terminal OUT2 of the duty cycle adjusting subcircuit 32 pulls down the second output signal n2_out1 (the lower the first input signal ck_c1 and the second input signal ck_t1 actually inputted are, the greater a deviation between the duty cycle of the second output signal n2_out1 and the preset value is), such that the duty cycle of the final output signal tends to the preset value, thereby implementing the automatic adjustment capability of the duty cycle adjusting subcircuit.

The drive circuit provided by the embodiments of the present disclosure determines the first output signal and the common-mode output signal or the signal obtained by inverting the common-mode output signal as the control signal of the duty cycle adjusting subcircuit, and changes a ratio of the pull-up capacity of the pull-up subcircuit to the pull-down capacity of the pull-down subcircuit of the duty cycle adjusting subcircuit (for example, a ratio of a turn-on degree of the PMOS transistor to a turn-on degree of the NMOS transistor), to implement automatic adjustment on the duty cycle of the second output signal.

A second embodiment of the present disclosure further provides a drive circuit. The second embodiment differs from the first embodiment in that the input stage does not include the first-stage phase inversion subcircuit, and the common output terminal OUT1 outputs the first output signal n1_out. The common-mode subcircuit 302 of the input stage 30 further includes a phase inverter P3. The common-mode output signal n_cm is inverted via the phase inverter P3 to serve as the control signal of the pull-up subcircuit 321 and of the pull-down subcircuit 322.

Figure 5:
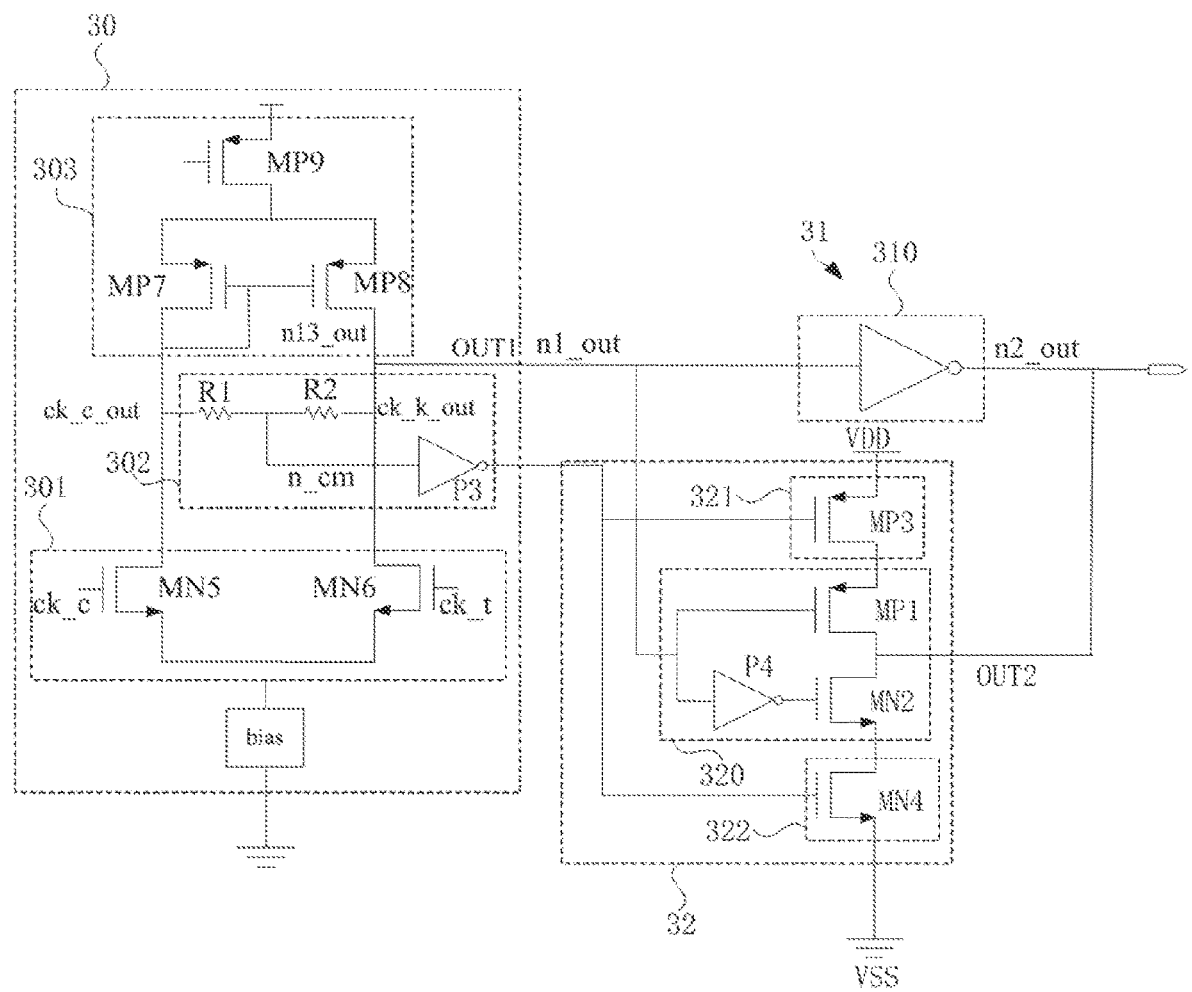
FIG. 5 is a schematic diagram of a drive circuit provided by a second embodiment of the present disclosure.

In some embodiments, referring to FIG. 5, which is a schematic diagram of the drive circuit provided by the second embodiment of the present disclosure, the output signal from the common output terminal OUT1 of the input stage 30 serves as the first output signal n1_out.

In this embodiment, because the output signal from the common output terminal OUT1 of the input stage 30 serves as the first output signal n1_out, to implement the automatic adjustment function of the duty cycle adjusting subcircuit 32, the signal obtained by inverting the common-mode output signal n_cm serves as the control signal of the pull-up subcircuit 321 and the pull-down subcircuit 322 of the duty cycle adjusting subcircuit 32. The first output signal n1_out serves as the control signal of the first transistor MP1 of the switching subcircuit 320, and the first output signal n1_out is inverted via the phase inverter P4 to serve as the control signal of the second transistor MN2 of the switching subcircuit 320.

The drive circuit provided by the second embodiment of the present disclosure can automatically adjust the duty cycle of the second output signal. When the input common-mode voltage of the first input signal is different from the input common-mode voltage of the second input signal, the duty cycle of the output signal finally outputted by the drive circuit tend to the preset value. That is, even if the input common-mode voltage of the first input signal and the input common-mode voltage of the second input signal are changed due to influences of factors such as channel transmission, the output signal finally outputted by the drive circuit may not fluctuate greatly, which improves the output performance of the drive circuit. Principles are described below.

Figure 6:
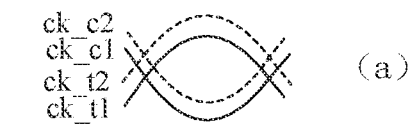
FIG. 6 is a signal waveform diagram of each node in FIG. 5.
Figure 6:
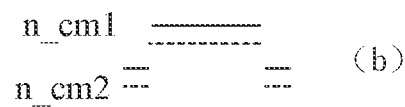
Figure 6:
Figure 6:
Figure 6:

Referring to FIG. 5 and FIG. 6, FIG. 6(a) is a waveform diagram of the first input signal and the second input signal, where solid lines represent waveforms of the first input signal ck_c1 and the second input signal ck_t1 actually inputted, and dashed lines represent waveforms of the first input signal ck_c2 and the second input signal ck_t2 preset. As can be seen from FIG. 4, the input common-mode voltages of the first input signal ck_c1 and the second input signal ck_t1 actually inputted are lower than the input common-mode voltages of the first input signal ck_c2 and the second input signal ck_t2 preset. The first input signal ck_c2 and the second input signal ck_t2 preset refer to ideal signals not adversely affected by factors such as channel attenuation during signal transmission.

Referring to FIG. 5 and FIG. 6, FIG. 6(b) is a waveform diagram of the common-mode output signal n_cm in FIG. 5, where the solid line represents the waveform diagram of the common-mode output signal n_cm1 formed by determining the first input signal ck_c1 and the second input signal ck_t1 actually inputted as the input signal, and the dashed line represents the waveform diagram of the common-mode output signal n_cm2 formed by determining the first input signal ck_c2 and the second input signal ck_t2 preset as the input signal. As can be seen from FIG. 6, the output common-mode voltage of the common-mode output signal n_cm1 is higher than the output common-mode voltage of the common-mode output signal n_cm2. In this embodiment, the common-mode output signal n_cm1 is inverted to serve as the control signal of the pull-up subcircuit 321 and the pull-down subcircuit 322.

Referring to FIG. 5 and FIG. 6, FIG. 6(c) is a waveform diagram of the first output signal n1_out outputted by the common output terminal OUT1 of the input stage 30 in FIG. 5, where the solid line represents the waveform diagram of the first output signal n1_out1 formed by determining the first input signal ck_c1 and the second input signal ck_t1 actually inputted as the input signal, and the dashed line represents the waveform diagram of the first output signal n1_out2 formed by determining the first input signal ck_c2 and the second input signal ck_t2 preset as the input signal. As can be seen from FIG. 6, the duty cycle of the first output signal n1_out1 is greater than the duty cycle of the first output signal n1_out2. That is, the duty cycle of the first output signal n1_out1 is greater than a preset value. The preset value may be 50%.

Referring to FIG. 5 and FIG. 6, FIG. 6(d) is a waveform diagram of the second output signal n2_out outputted by the output stage 31 in FIG. 5, where the solid line represents the waveform diagram of the second output signal n2_out1 formed by determining the actually outputted first output signal n1_out1 as the input signal of the output stage 31, and the dashed line represents the waveform diagram of the second output signal n2_out2 formed by determining the preset first output signal n1_out2 as the input signal of the output stage 31. As can be seen from FIG. 6, high-level time of the second output signal n2_out1 is shorter than that of the second output signal n2_out2. That is, the duty cycle of the second output signal n2_out1 is smaller than that of the second output signal n2_out2.

To make the duty cycle of the second output signal n2_out1 tend to the preset value, the second output signal n2_out1 needs to be pulled up to prolong its high-level time. Because the first input signal ck_c and the second input signal ck_t are outputted through the NMOS transistor, the higher the input common-mode voltages of the first input signal ck_c and the second input signal ck_t are, the higher the turn-on degree of the NMOS transistor is, the lower the output voltage of the NMOS transistor is, and thus the lower the output common-mode voltage of the common-mode output signal n_cm is. In this embodiment, the output common-mode voltage of the common-mode output signal n_cm1 is higher than the output common-mode voltage of the common-mode output signal n_cm2. In this case, the common-mode output signal n_cm1 is inverted to serve as the control signal, such that the pull-up capacity of the pull-up subcircuit 321 of the duty cycle adjusting subcircuit 32 is better than the pull-down capacity of the pull-down subcircuit 322, such that the output signal from the output terminal OUT2 of the duty cycle adjusting subcircuit 32 pulls up the second output signal n2_out1 to increase its duty cycle, thereby forming the final output signal. FIG. 6(e) is a waveform diagram of the output signal finally outputted by the drive circuit, where the solid line represents the waveform diagram of the final output signal n3_out1 formed after the second output signal n1_out1 is adjusted by the duty cycle adjusting subcircuit, and the dashed line represents the waveform diagram of the preset final output signal n3_out2. As can be seen from FIG. 6, the duty cycle of the final output signal n3_out1 is approximate to the duty cycle of the final output signal n3_out, which improves the output stability of the drive circuit.

It is to be understood that, the lower the first input signal ck_c1 and the second input signal ck_t1 actually inputted are, the higher the output common-mode voltage of the common-mode output signal n_cm is, the lower the common-mode output signal n_cm inverted is, the better the pull-up capacity of the pull-up subcircuit 321 of the duty cycle adjusting subcircuit 32 is than the pull-down capacity of the pull-down subcircuit 322, and the more the output signal from the output terminal OUT2 of the duty cycle adjusting subcircuit 32 pulls up the second output signal n2_out1 (the lower the first input signal ck_c1 and the second input signal ck_t1 actually inputted are, the greater the deviation between the duty cycle of the second output signal n2_out1 and the preset value is), such that the duty cycle of the final output signal tends to the preset value, thereby implementing the automatic adjustment capability of the duty cycle adjusting subcircuit.

The above example illustrates how does the drive circuit automatically adjust the duty cycle of the output signal by means of the duty cycle adjusting subcircuit in the case where the input common-mode voltages of the actually inputted first input signal and second input signal are lower than the input common-mode voltages of the first input signal and the second input signal preset. For the case where the input common-mode voltages of the actually inputted first input signal and second input signal are higher than the input common-mode voltages of the first input signal and the second input signal preset, the drive circuit may also automatically adjust the duty cycle of the output signal by means of the duty cycle adjusting subcircuit, such that the duty cycle tends to the preset value.

Figure 7:
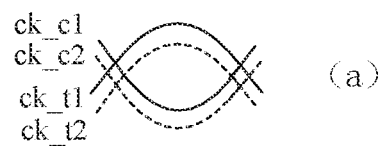
FIG. 7 is another signal waveform diagram of each node in FIG. 5.
Figure 7:
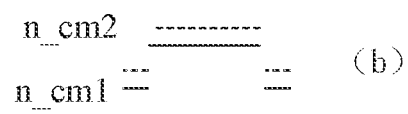
Figure 7:
Figure 7:
Figure 7:

In some embodiments, referring to FIG. 5 and FIG. 7, FIG. 7(a) is a waveform diagram of the first input signal and the second input signal, where solid lines represent waveforms of the first input signal ck_c1 and the second input signal ck_t1 actually inputted, and dashed lines represent waveforms of the first input signal ck_c2 and the second input signal ck_t2 preset. As can be seen from FIG. 5, the input common-mode voltages of the first input signal ck_c1 and the second input signal ck_t1 actually inputted are lower than the input common-mode voltages of the first input signal ck_c2 and the second input signal ck_t2 preset. The first input signal ck_c2 and the second input signal ck_t2 preset refer to ideal signals not adversely affected by factors such as channel attenuation during signal transmission.

Referring to FIG. 5 and FIG. 7, FIG. 7(b) is a waveform diagram of the common-mode output signal n_cm in FIG. 5, where the solid line represents the waveform diagram of the common-mode output signal n_cm1 formed by determining the first input signal ck_c1 and the second input signal ck_t1 actually inputted as the input signal, and the dashed line represents the waveform diagram of the common-mode output signal n_cm2 formed by determining the first input signal ck_c2 and the second input signal ck_t2 preset as the input signal. As can be seen from FIG. 7, the output common-mode voltage of the common-mode output signal n_cm1 is lower than the output common-mode voltage of the common-mode output signal n_cm2. In this embodiment, the common-mode output signal n_cm1 is inverted to serve as the control signal of the pull-up subcircuit 321 and the pull-down subcircuit 322.

Referring to FIG. 5 and FIG. 7, FIG. 7(c) is a waveform diagram of the first output signal n1_out outputted by the common output terminal OUT1 of the input stage 30 in FIG. 5, where the solid line represents the waveform diagram of the first output signal n1_out1 formed by determining the first input signal ck_c1 and the second input signal ck_t1 actually inputted as the input signal, and the dashed line represents the waveform diagram of the first output signal n1_out2 formed by determining the first input signal ck_c2 and the second input signal ck_t2 preset as the input signal. As can be seen from FIG. 7, the duty cycle of the first output signal n1_out1 is smaller than the duty cycle of the first output signal n1_out2. That is, the duty cycle of the first output signal n1_out1 is smaller than a preset value. The preset value may be 50%.

Referring to FIG. 5 and FIG. 7, FIG. 7(d) is a waveform diagram of the second output signal n2_out outputted by the output stage 31 in FIG. 5, where the solid line represents the waveform diagram of the second output signal n2_out1 formed by determining the actually outputted first output signal n1_out1 as the input signal of the output stage 31, and the dashed line represents the waveform diagram of the second output signal n2_out2 formed by determining the preset first output signal n1_out2 as the input signal of the output stage 31. As can be seen from FIG. 7, high-level time of the second output signal n2_out1 is longer than that of the second output signal n2_out2. That is, the duty cycle of the second output signal n2_out1 is greater than that of the second output signal n2_out2.

To make the duty cycle of the second output signal n2_out1 tend to the preset value, the second output signal n2_out1 needs to be pulled down to prolong its low-level time. Because the first input signal ck_c and the second input signal ck_t are outputted through the NMOS transistor, the higher the input common-mode voltages of the first input signal ck_c and the second input signal ck_t are, the lower the output common-mode voltage of the common-mode output signal n_cm is. In this embodiment, the output common-mode voltage of the common-mode output signal n_cm1 is lower than the output common-mode voltage of the common-mode output signal n_cm2. In this case, the common-mode output signal n_cm1 is inverted to serve as the control signal, and the pull-down capacity of the pull-down subcircuit 322 of the duty cycle adjusting subcircuit 32 is better than the pull-up capacity of the pull-up subcircuit 321, such that the output signal from the output terminal OUT2 of the duty cycle adjusting subcircuit 32 pulls down the second output signal n2_out1 to increase its duty cycle, thereby forming the final output signal. FIG. 7(e) is a waveform diagram of the output signal finally outputted by the drive circuit, where the solid line represents the waveform diagram of the final output signal n3_out1 formed after the second output signal n1_out1 is adjusted by the duty cycle adjusting subcircuit, and the dashed line represents the waveform diagram of the preset final output signal n3_out2. As can be seen from FIG. 7, the duty cycle of the final output signal n3_out1 is approximate to the duty cycle of the final output signal n3_out, which improves the output stability of the drive circuit.

The drive circuit provided by the embodiments of the present disclosure determines the first output signal and the common-mode output signal or the signal obtained by inverting the common-mode output signal as the control signal of the duty cycle adjusting subcircuit, and changes a ratio of the pull-up capacity of the pull-up subcircuit to the pull-down capacity of the pull-down subcircuit of the duty cycle adjusting subcircuit (for example, a ratio of a turn-on degree of the PMOS transistor to a turn-on degree of the NMOS transistor), to implement automatic adjustment on the duty cycle of the second output signal.

Figure 8:
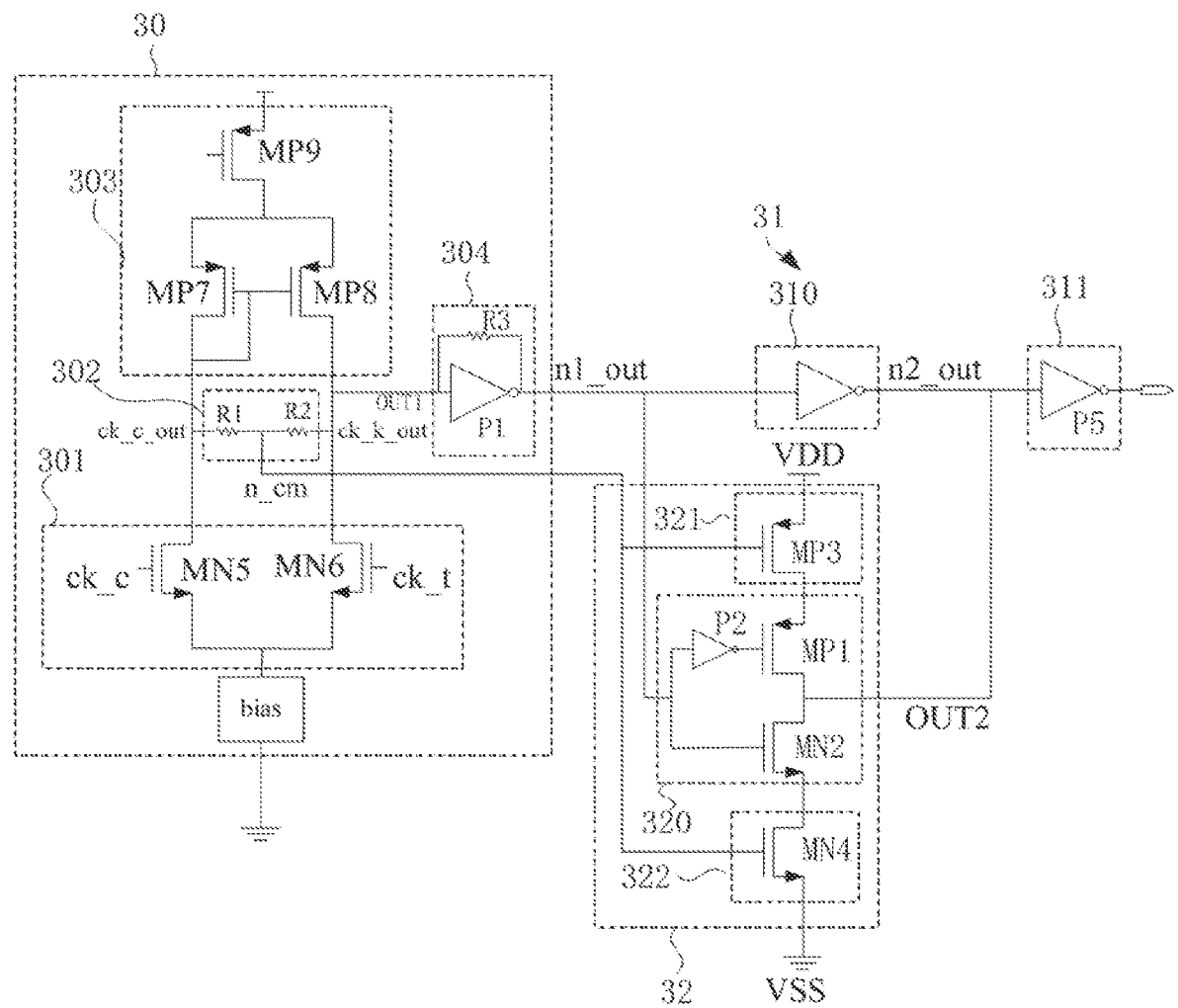
FIG. 8 is a schematic diagram of a drive circuit provided by a third embodiment of the present disclosure.

A third embodiment of the present disclosure further provides a drive circuit. Referring to FIG. 8, which is a schematic diagram of the drive circuit provided by the third embodiment of the present disclosure, the third embodiment differs from the first embodiment in that the output stage 31 further includes a third-stage phase inversion subcircuit 311, the second output signal n2_out whose duty cycle is adjusted via the duty cycle adjusting subcircuit serves as the input signal of the third-stage phase inversion subcircuit 311, and an output signal from the third-stage phase inversion subcircuit 311 serves as the output signal from the drive circuit. The second output signal n2_out whose duty cycle is adjusted via the duty cycle adjusting subcircuit is outputted after being shaped by the third-stage phase inversion subcircuit 311. The third-stage phase inversion subcircuit 311 includes odd number of phase inverters connected in series. For example, in this embodiment, the third-stage phase inversion subcircuit 311 includes one phase inverter P5, and the second output signal n2_out whose duty cycle is adjusted via the duty cycle adjusting subcircuit is inverted via the phase inverter P5 and then is outputted as the output signal of the drive circuit. In some other embodiments, the third-stage phase inversion subcircuit 311 may also include three or more odd-numbered phase inverters connected in series. FIG. 4(f) is a waveform diagram of the output signal from the output terminal of the third-stage phase inversion subcircuit 311. The output signal from the drive circuit is enhanced in stability after being shaped by the third-stage phase inversion subcircuit 311.

In the second embodiment, the fifth transistor and the sixth transistor of the signal receiving subcircuit are both NMOS transistors, and in other embodiments, both the fifth transistor and the sixth transistor may also be PMOS transistors. In some embodiments, referring to FIG. 9, which is a schematic diagram of a drive circuit provided by a fourth embodiment of the present disclosure. The difference between the fourth embodiment and the second embodiment is as below. The fifth transistor of the signal receiving subcircuit 301 is a PMOS transistor MP5, and the sixth transistor of the signal receiving subcircuit 301 is a PMOS transistor MP6. The seventh transistor of the control subcircuit 303 is an NMOS transistor MN7, and the eighth transistor of the control subcircuit 303 is an NMOS transistor MN8. The input stage 30 includes a first-stage phase inversion subcircuit 304, an input terminal of the first-stage phase inversion subcircuit 304 is connected to the common output terminal OUT1, an output signal from the common output terminal OUT1 of the input stage 30 serves as the input signal of the first-stage phase inversion subcircuit 304, an output terminal of the first-stage phase inversion subcircuit 304 serves as the output terminal of the input stage 30, and an output signal from the first-stage phase inversion subcircuit 304 serves as the first output signal n1_out.

The drive circuit provided by the fourth embodiment of the present disclosure can automatically adjust the duty cycle of the second output signal, and principles thereof are described as follows.

Figure 9:
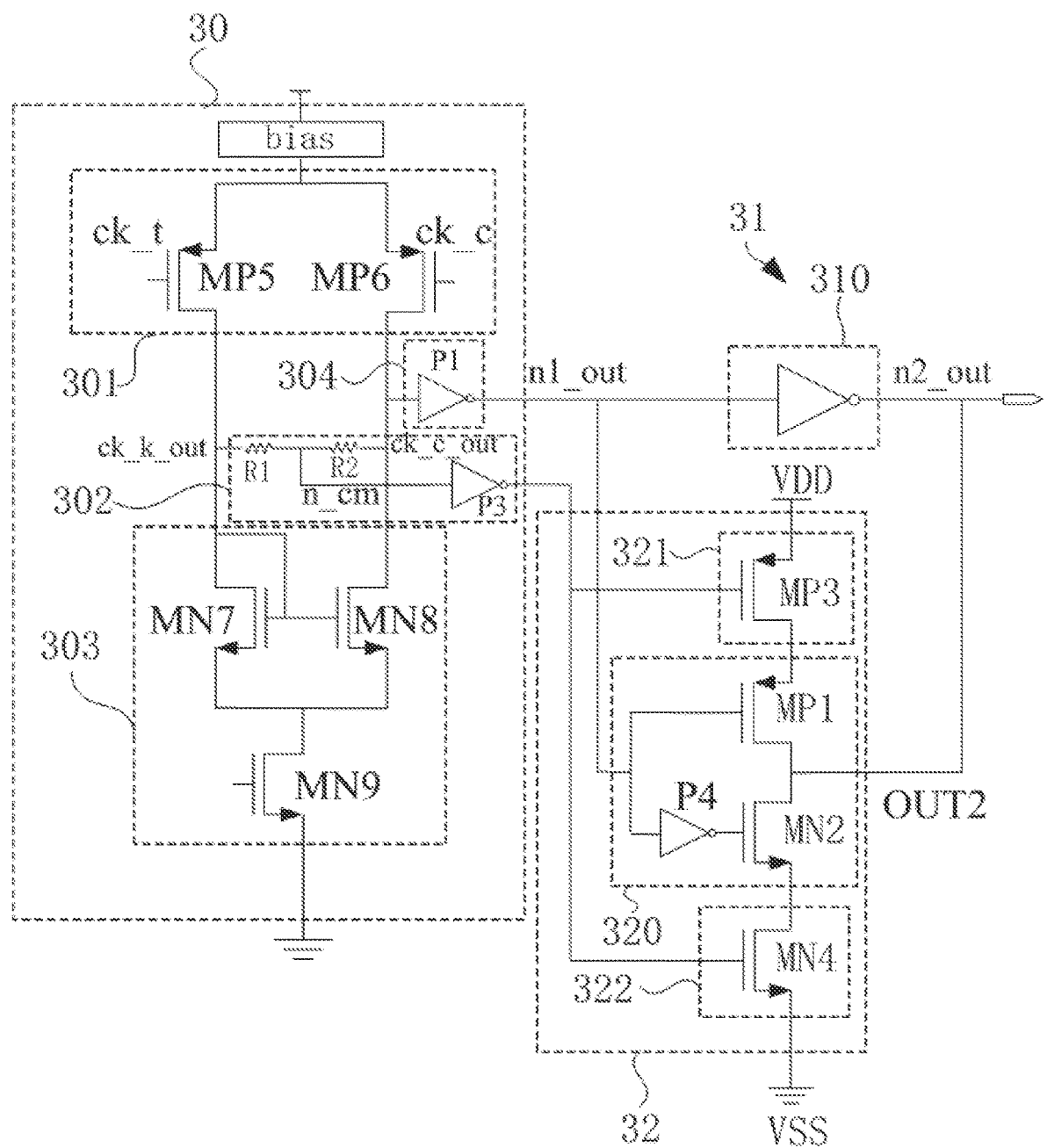
FIG. 9 is a schematic diagram of a drive circuit provided by a fourth embodiment of the present disclosure.
Figure 10:
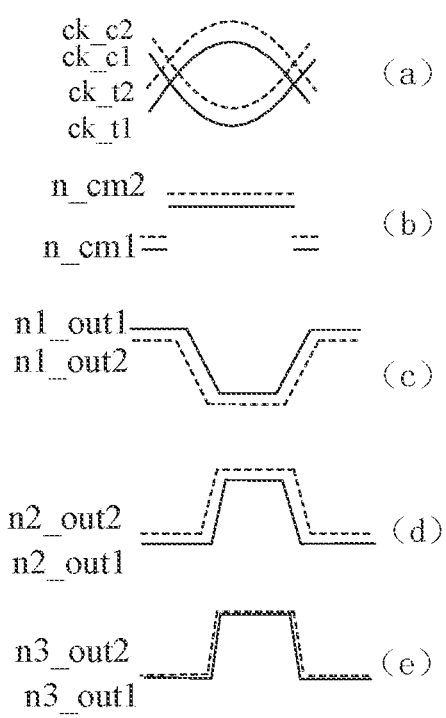
FIG. 10 is a signal waveform diagram of each node in FIG. 9.

Referring to FIG. 9 and FIG. 10, FIG. 10(a) is a waveform diagram of the first input signal and the second input signal, where solid lines represent waveforms of the first input signal ck_c1 and the second input signal ck_t1 actually inputted, and dashed lines represent waveforms of the first input signal ck_c2 and the second input signal ck_t2 preset. As can be seen from FIG. 10, the input common-mode voltages of the first input signal ck_c1 and the second input signal ck_t1 actually inputted are lower than the input common-mode voltages of the first input signal ck_c2 and the second input signal ck_t2 preset. The first input signal ck_c2 and the second input signal ck_t2 preset refer to ideal signals not adversely affected by factors such as channel attenuation during signal transmission.

Referring to FIG. 9 and FIG. 10, FIG. 10(*b*) is a waveform diagram of the common-mode output signal n_cm in FIG. 9, where the solid line represents the waveform diagram of the common-mode output signal n_cm1 formed by determining the first input signal ck_c1 and the second input signal ck_t1 actually inputted as the input signal, and the dashed line represents the waveform diagram of the common-mode output signal n_cm2 formed by determining the first input signal ck_c2 and the second input signal ck_t2 preset as the input signal. As can be seen from FIG. 10, the output common-mode voltage of the common-mode output signal n_cm1 is lower than the output common-mode voltage of the common-mode output signal n_cm2. In this embodiment, the common-mode output signal n_cm1 is inverted to serve as the control signal of the pull-up subcircuit 321 and the pull-down subcircuit 322.

Referring to FIG. 9 and FIG. 10, FIG. 10(*c*) is a waveform diagram of the first output signal n1_out outputted by the output terminal of the first-stage phase inversion subcircuit 304 in FIG. 9, where the solid line represents the waveform diagram of the first output signal n1_out1 formed by determining the first input signal ck_c1 and the second input signal ck_t1 actually inputted as the input signal, and the dashed line represents the waveform diagram of the first output signal n1_out2 formed by determining the first input signal ck_c2 and the second input signal ck_t2 preset as the input signal. As can be seen from FIG. 10, the duty cycle of the first output signal n1_out1 is greater than the duty cycle of the first output signal n1_out2. That is, the duty cycle of the first output signal n1_out1 is greater than a preset value. The preset value may be 50%.

Referring to FIG. 9 and FIG. 10, FIG. 10(*d*) is a waveform diagram of the second output signal n2_out outputted by the output stage 31 in FIG. 9, where the solid line represents the waveform diagram of the second output signal n2_out1 formed by determining the actually outputted first output signal n1_out1 as the input signal of the output stage 31, and the dashed line represents the waveform diagram of the second output signal n2_out2 formed by determining the preset first output signal n1_out2 as the input signal of the output stage 31. As can be seen from FIG. 10, high-level time of the second output signal n2_out1 is shorter than that of the second output signal n2_out2. That is, the duty cycle of the second output signal n2_out1 is smaller than that of the second output signal n2_out2.

To make the duty cycle of the second output signal n2_out1 tend to the preset value, the second output signal n2_out1 needs to be pulled up to prolong its high-level time. Because the first input signal ck_c and the second input signal ck_t are outputted via the PMOS transistor, the lower the input common-mode voltages of the first input signal ck_c and the second input signal ck_t are, the higher the output common-mode voltage of the common-mode output signal n_cm is. For example, in this embodiment, the input common-mode voltages of the first input signal ck_c1 and the second input signal ck_t1 actually inputted are lower, and the output common-mode voltage of the common-mode output signal n_cm is higher. In this case, the pull-down capacity of the pull-down subcircuit 322 of the duty cycle adjusting subcircuit 32 is better than the pull-up capacity of the pull-up subcircuit 321, such that the output signal from the output terminal OUT2 of the duty cycle adjusting subcircuit 32 pulls down the second output signal n2_out1 to reduce its duty cycle, thereby forming the final output signal. FIG. 10(*e*) is a waveform diagram of the output signal finally outputted by the drive circuit, where the solid line represents the waveform diagram of the final output signal n3_out1 formed after the second output signal n1_out1 is adjusted by the duty cycle adjusting subcircuit, and the dashed line represents the waveform diagram of the preset final output signal n3_out2. As can be seen from FIG. 10, the duty cycle of the final output signal n3_out1 is approximate to the duty cycle of the final output signal n3_out, which improves the output stability of the drive circuit.

The above merely are some embodiments of the present disclosure. It is to be pointed out that to those of ordinary skill in the art, various improvements and embellishments may be made without departing from the principles of the present disclosure, and these improvements and embellishments are also deemed to be within the scope of protection of the present disclosure.

What is claimed is:

1. A drive circuit, comprising:
    an input stage configured to receive a first input signal and a second input signal, and to output a first output signal and a common-mode output signal, the first input signal and the second input signal being complementary signals;
    an output stage configured to receive the first output signal, and to output a second output signal; and
    a duty cycle adjusting subcircuit configured to determine the first output signal and the common-mode output signal or a signal obtained by inverting the common-mode output signal as a control signal, and to adjust a duty cycle of the second output signal.

2. The drive circuit according to claim 1, wherein the duty cycle adjusting subcircuit comprises:
    a switching subcircuit configured to determine the first output signal as the control signal;
    a pull-up subcircuit electrically connected to a first power supply, the pull-up subcircuit being configured to determine the common-mode output signal or the signal obtained by inverting the common-mode output signal as the control signal, the pull-up subcircuit being connected to an output terminal of the duty cycle adjusting subcircuit via the switching subcircuit; and
    a pull-down subcircuit electrically connected to a second power supply, the pull-down subcircuit being configured to determine the common-mode output signal or the signal obtained by inverting the common-mode output signal as the control signal, the pull-down subcircuit being connected to the output terminal of the duty cycle adjusting subcircuit via the switching subcircuit.

3. The drive circuit according to claim 2, wherein the switching subcircuit comprises:
    a first transistor, a terminal of the first transistor being electrically connected to the pull-up subcircuit, other terminal of the first transistor being electrically connected to the output terminal of the duty cycle adjusting subcircuit, a control terminal of the first transistor being configured to determine the first output signal as the control signal; and
    a second transistor, a terminal of the second transistor being electrically connected to the pull-up subcircuit, other terminal of the second transistor being electrically connected to the output terminal of the duty cycle adjusting subcircuit, a control terminal of the second transistor being configured to determine the first output signal as the control signal.

4. The drive circuit according to claim 3, wherein the first transistor and the second transistor are different types of transistors, and after the first output signal is inverted via a phase inverter, the first output signal inverted serves as the control signal of the first transistor.

5. The drive circuit according to claim 3, wherein the first transistor and the second transistor are different types of transistors, and after the first output signal is inverted via a phase inverter, the first output signal inverted serves as the control signal of the second transistor.

6. The drive circuit according to claim 2, wherein the pull-up subcircuit comprises a third transistor, the pull-down subcircuit comprising a fourth transistor, and the third transistor and the fourth transistor being different types of transistors.

7. The drive circuit according to claim 1, wherein the input stage comprises:
a common output terminal configured to output the first output signal;
a signal receiving subcircuit connected to the common output terminal, the signal receiving subcircuit being configured to receive the first input signal and the second input signal, and to output a first output sub-signal and a second output sub-signal complementary to each other, the second output sub-signal being outputted to the common output terminal;
a common-mode subcircuit connected to the signal receiving subcircuit, the common-mode subcircuit being configured to output the common-mode output signal according to a voltage difference between the first output sub-signal and the second output sub-signal; and
a control subcircuit, a terminal of the control subcircuit being electrically connected to a power supply, other terminal of the control subcircuit being electrically connected to the common output terminal, the control subcircuit being configured to determine the first output sub-signal as an input signal and to output a third output sub-signal, the third output sub-signal and the second output sub-signal jointly serving as the first output signal.

8. The drive circuit according to claim 7, wherein the signal receiving subcircuit comprises:
a fifth transistor configured to determine the first input signal as the control signal, a terminal of the fifth transistor being electrically connected to the power supply, and other terminal of the fifth transistor serving as an output terminal configured to output the first output sub-signal; and
a sixth transistor configured to determine the second input signal as the control signal, a terminal of the sixth transistor being electrically connected to the power supply, and other terminal of the sixth transistor serving as the output terminal configured to output the second output sub-signal.

9. The drive circuit according to claim 8, wherein the fifth transistor and the sixth transistor are transistors of the same type.

10. The drive circuit according to claim 7, wherein the common-mode subcircuit comprises a first resistor and a second resistor connected in series, a terminal of the first resistor being connected to the signal receiving subcircuit to receive the first output sub-signal, a terminal of the second resistor being connected to the signal receiving subcircuit to receive the second output sub-signal, and a common terminal between the first resistor and the second resistor serving as an output terminal of the common-mode subcircuit to output the common-mode output signal.

11. The drive circuit according to claim 7, wherein the control subcircuit comprises:
a seventh transistor, a gate and a drain of the seventh transistor being short-circuited, the drain of the seventh transistor being configured to receive the first output sub-signal, a source of the seventh transistor being electrically connected to the power supply; and
an eighth transistor, a gate of the eighth transistor being configured to receive the first output sub-signal, a source of the eighth transistor being electrically connected to the power supply, and a drain of the eighth transistor being connected to the common output terminal configured to output the third output sub-signal.

12. The drive circuit according to claim 11, wherein the control subcircuit further comprises:
a ninth transistor, a gate of the ninth transistor being configured to receive a clock enable signal, a source of the ninth transistor being electrically connected to the power supply, a drain of the ninth transistor being electrically connected to the source of the seventh transistor and the source of the eighth transistor.

13. The drive circuit according to claim 1, wherein the input stage comprises a first-stage phase inversion subcircuit, an output signal from the input stage serving as an input signal of the first-stage phase inversion subcircuit, and an output signal from the first-stage phase inversion subcircuit serving as the first output signal.

14. The drive circuit according to claim 13, wherein the first-stage phase inversion subcircuit comprises a first phase inverter, an input terminal and an output terminal of the first phase inverter being connected to each other via a resistor.

15. The drive circuit according to claim 1, wherein the output stage comprises a second-stage phase inversion subcircuit, the first output signal serving as an input signal of the second-stage phase inversion subcircuit, and an output signal from the second-stage phase inversion subcircuit serving as the second output signal.

16. The drive circuit according to claim 15, wherein the second-stage phase inversion subcircuit is formed by connecting an odd or even number of phase inverters in series.

17. The drive circuit according to claim 1, wherein the output stage further comprises a third-stage phase inversion subcircuit, the second output signal whose duty cycle is adjusted via the duty cycle adjusting subcircuit serving as an input signal of the third-stage phase inversion subcircuit, and an output signal from the third-stage phase inversion subcircuit serving as an output signal from the drive circuit.

* * * * *